US010385265B2

(12) United States Patent
Liu et al.

(10) Patent No.: US 10,385,265 B2
(45) Date of Patent: Aug. 20, 2019

(54) RED PHOSPHOR POWDER, PREPARATION METHOD THEREOF AND LUMINESCENT DEVICE COMPRISING SAME

(71) Applicant: Grirem Advanced Materials Co., Ltd., Beijing (CN)

(72) Inventors: Ronghui Liu, Beijing (CN); Guantong Chen, Beijing (CN); Yuming Jin, Beijing (CN); Xiaole MA, Beijing (CN); Yuanhong Liu, Beijing (CN); Lengleng Shao, Beijing (CN)

(73) Assignee: Grirem Advanced Materials Co., Ltd., Beijing (CN)

( * ) Notice: Subject to any disclaimer, the term of this patent is extended or adjusted under 35 U.S.C. 154(b) by 0 days.

(21) Appl. No.: 16/060,548

(22) PCT Filed: Dec. 7, 2016

(86) PCT No.: PCT/CN2016/108765
§ 371 (c)(1),
(2) Date: Jun. 8, 2018

(87) PCT Pub. No.: WO2017/114108
PCT Pub. Date: Jul. 6, 2017

(65) Prior Publication Data
US 2018/0355243 A1 Dec. 13, 2018

(30) Foreign Application Priority Data
Dec. 29, 2015 (CN) .......................... 2015 1 1018726

(51) Int. Cl.
*C09K 11/67* (2006.01)
*C09K 11/66* (2006.01)
(Continued)

(52) U.S. Cl.
CPC ........ *C09K 11/676* (2013.01); *C09K 11/0883* (2013.01); *C09K 11/665* (2013.01);
(Continued)

(58) Field of Classification Search
CPC . C09K 11/676; C09K 11/7734; C09K 11/665; C09K 11/0883; C09K 11/666;
(Continued)

(56) References Cited

U.S. PATENT DOCUMENTS

2015/0054400 A1* 2/2015 Murphy ............... C09K 11/675
313/503

FOREIGN PATENT DOCUMENTS

JP 2013014715 A 1/2013
WO 2015056525 A1 4/2015

OTHER PUBLICATIONS

English Translation of International Search Report for International Application No. PCT/CN2016/108765, dated Mar. 3, 2017, 2 pages.

* cited by examiner

*Primary Examiner* — Caleen O Sullivan
(74) *Attorney, Agent, or Firm* — Armstrong Teasdale LLP (57) ABSTRACT

The present disclosure provides a red phosphor powder, a preparation method thereof and a luminescent device comprising the red phosphor powder. The red phosphor powder comprises inorganic compounds containing an element A, an element D, an element X and manganese, wherein element A is one or more selected from a group of Li, Na and K and necessarily includes K; element D is composed of Ge and Si, or element D is composed of Si, Ge and Ti; and element X is one or more selected from a group of F, Br and Cl and necessarily includes F; and the inorganic compound has the same space group structure as $K_2GeF_6$, the space group structure being the hexagonal crystal system P-$6_3$mc (Continued)

(186). The red phosphor powder has a uniform morphology, a high luminescent efficiency and a good stability.

8 Claims, 5 Drawing Sheets

(51) Int. Cl.
    *C09K 11/77*     (2006.01)
    *C09K 11/08*     (2006.01)
    *H01L 33/50*     (2010.01)

(52) U.S. Cl.
    CPC ........ *C09K 11/666* (2013.01); *C09K 11/7734* (2013.01); *H01L 33/504* (2013.01); *H01L 33/502* (2013.01)

(58) Field of Classification Search
    CPC ..... C09K 11/66; C09K 11/617; H01L 33/504; H01L 33/50; H01L 33/502; F21V 9/30
    USPC ............................................ 313/503; 257/98
    See application file for complete search history.

RED PHOSPHOR POWDER, PREPARATION METHOD THEREOF AND LUMINESCENT DEVICE COMPRISING SAME

CROSS-REFERENCE TO RELATED APPLICATIONS

This application is the national stage entry of PCT/CN2016/108765, filed on Dec. 7, 2016, which claims the benefit of priority to Chinese Patent Application No. 201511018726.9, filed Dec. 29, 2015, which are incorporated by reference in their entirety herein.

TECHNICAL FIELD

The present disclosure relates to the technical field of semiconductor, and in particular a red phosphor powder, a preparation method thereof and a luminescent device comprising the red phosphor powder.

BACKGROUND

Nichia Corporation invented GaN-substrate blue light LED (light-emitting diode) in 1993, breaking through the technical bottleneck of blue light LED. The successful development of the high-brightness blue light LED in 1996 made it possible to combine yellow, green, and red phosphor powders into white light LED by stimulating the phosphors using blue light LED chips. Owing to the advantages such as high brightness, long life, and zero pollution, white light LED (also called semiconductor lighting source) is considered as a new-generation green lighting source, presenting a rapid development speed.

At present, white light LED is mainly used in lighting and display fields. In the display field, the display gamut is an important parameter for measuring the LED display device, i.e., the wider the display gamut is, and the richer the colors in the picture are. The LED backlight based LCD display has the advantages of good color reduction, low power consumption, long life and so on, occupying more than 90% of the LCD market. However, most display gamut of the currently used LED backlight based LCD display devices is about 70% NTSC (National Television Standards Committee), greatly reducing the viewing experience. The main reason is that the photochromic properties of the red phosphor powder used in the current white light LED have limitations in color purity, color coordinates and half width. As the viewing demand rises, wide color range LCD with the display gamut higher than 85NTSC % has gradually become one of the development trends in the LCD field. Since $Mn^{4+}$ activated fluoride red phosphor powder has high excitation efficiency in the 460 nm blue light region, and can emit highly pure red light of which the mainly emitted light is at 630 nm, it can satisfactorily satisfy the requirements of the LED backlight devices in the wide color rang LCD.

Fluoride fluorescent material originates from the $K_2SiF_6$:$Mn^{4+}$ fluoride fluorescent material reported by Paulusz of OS RAM from Germany in 1973. After the disclosure of white light LED in 1996, researchers had a new understanding about it. After 2006, the research of fluoride fluorescent materials gradually became the focus of scientific research and industrialization. LIU Ruxi synthesised a $K_2TiF_6$:$Mn^{4+}$ red fluorescence material with the quantum efficiency (the ratio of the produced photons to all incident photons) up to 98% by replacing $Mn^{4+}$ with some $Ti^{4+}$ in $K_2TiF_6$ in the cation replacement method. Adachia's team synthesised a golden yellow $K_2SiF_6$:$Mn^{4+}$ precipitation with an average particle size of about 80 μm by etching monocrystalline silicon for 10 minutes in a $HF/KMnO_4/H_2O$ solution in the etching method. However, the fluoride phosphors that have been reported are irregular in morphology, low in quantum efficiency and poor in photochromic property, and cannot well meet the requirements of real white light LED phosphor powder, such as high luminous efficiency, uniform morphology and suitable particle size.

SUMMARY

The main objective of the present disclosure is providing a red phosphor powder, a preparation method thereof and a luminescent device comprising the red phosphor powder, so as to improve the photochromic property of the red phosphor powder.

In order to achieve the above objective, according to one aspect of the present disclosure, a red phosphor powder is provided, which comprises inorganic compounds containing an element A, an element D, an element X and an element manganese, wherein element A is one or more selected from a group of Li, Na and K, and element A necessarily includes K; element D is composed of Ge and Si, or element D is composed of Si, Ge and Ti; and element X is one or more selected from a group of F, Br and Cl, and element X necessarily includes F; and the inorganic compound has the same space group structure as $K_2GeF_6$, the space group structure being a hexagonal crystal system P-$6_3$mc(186).

Further, a chemical formula of the inorganic compound is represented by $A_aD_{1-c}X_b$:$cMn^{4+}$, wherein 1.5≤a≤2.5, 5.5≤b≤6.5, 0.01≤c≤0.3.

Further, a molar ratio of element K in element A is greater than or equal to 90%, a molar ratio of element Ti in element D is less than or equal to 10%, and a molar ratio of element F in element X is greater than or equal to 90%.

Further, element A in the inorganic compound is element K, and element X is element F.

Further, the chemical formula of the inorganic compound is represented by $K_2[(Ge_{1-x}Si_x)_{1-c}F_6]$:$cMn^{4+}$, wherein 0.1≤x≤0.4, 0.05≤c≤0.15.

In order to achieve the above objective, according to one aspect of the present disclosure, a preparation method of red phosphor powder is provided, wherein that the preparation method comprising: according to the above stoichiometric ratio, weighing compounds of element A, element D, element X, and element manganese respectively to obtain compounds containing each of said elements; dissolving the compounds containing each of said elements in a 20~60 wt % HF solution respectively to obtain solving liquids containing each of said elements; mixedly dripping the solving liquids containing each of said elements and stirring to obtain a mixed solution; quietly placing, filtering and drying the mixed solution in sequence to obtain the red phosphor powder.

In accordance with a further aspect of the present disclosure, there is provided a luminescent device, the luminescent device comprising a semiconductor luminescent chip and a fluorescent material composition, the fluorescent material composition comprising a first fluorescent material which is any of the above red phosphor powders.

Further, the semiconductor luminescent chip is a LED chip that emits the peak wavelength of 440~470 nm.

Further, the fluorescent material composition further comprises a second fluorescent material, which is selected from any one or more of: $(Y,Gd,Lu,Tb)_3(Al,Ga)_5O_{12}$:Ce, β-SiAlON:Eu, $Ca_3(Sc,Mg)_2Si_3O_{12}$:Ce, $(Sr,Ca)_2Si_5N_8$:Eu, (Sr,Ca)AlSiN$_3$:Eu, $(Sr,Ca,Ba,Mg)_5(PO_4)_3Cl$:Eu, (Ca,Sr,Ba)

MgAl$_{10}$O$_{17}$:Eu,Mn, 3.5MgO.0.5MgF$_2$.GeO$_2$:Mn, ZnS, ZnSe, ZnTe, CdS, CdSe, CdTe, HgS, HgSe, CdSe/CdS, CdSe/ZnS, CdSe/ZnS/CdSe, CdS/HgS, ZnSe/CdSe, CuInS2/ZnS, ZnCuInS/ZnS, ZnSeS:Mn, ZnSe:Mn, ZnS:Mn, ZnInS:Cu, ZnSe:Cu, CdS:Mn/ZnS, ZnSe/ZnS:Mn/ZnS and CdSe:Ag.

In the technical solution of the present disclosure, by making full use of the feature of preferential growth during the generation of K$_2$SiF$_6$:Mn$^{4+}$, K$_2$GeF$_6$:Mn$^{4+}$ and K$_2$TiF$_6$:Mn$^{4+}$ phosphor powders, a small amount of element K, element Ge, element F and other elements in the K$_2$GeF$_6$:Mn$^{4+}$ phosphor powder are replaced respectively in the principle of same-family elements substitution, thereby red phosphor powder having a crystal structure the same as K$_2$GeF$_6$ and a crystal structure of the P-6$_3$mc(186) space group is obtained. This red phosphor powder has the characteristics such as homogeneous morphology, high luminescence efficiency and good stability, and a luminescent device produced by combining this red phosphor powder with a blue light LED chip is suitable for producing a LED backlight based LCD.

BRIEF DESCRIPTION OF THE DRAWINGS

For a better understanding of the present disclosure, accompanying drawings described hereinafter are provided to constitute one part of the application; the schematic embodiments of the present disclosure and the description thereof are used to illustrate the present disclosure but to limit the present disclosure improperly. In the accompanying drawings.

DETAILED DESCRIPTION OF THE EMBODIMENTS

The present disclosure will be described below with reference to the drawing and in conjunction with embodiments. It should be noted that the embodiments in this application and the characteristics of the embodiments can be combined with each other if no conflict is caused.

It should be noted that the terms used herein are only for describing the embodiments and not intended to limit the exemplary embodiments according to this application. As used herein, unless otherwise specified in the context, the singular form is also intended to include the plural form. In addition, it should also be understood that when the terms "comprise" and/or "include" are used in the Description, it indicates that there exist characteristics, steps, operations, devices, components and/or combinations thereof.

In the study of solid phase synthesis of phosphor materials, the cation replacement method is a more common means to regulate the photochromic properties and structures of phosphors. However, for phosphor in the fluoride system, on the one hand, it is not suitable for solid-phase synthesis, and on the other hand, there is no report on regulating photochromic properties and structures in manner of element replacement in the prior art. Therefore, in the present application, an in-depth research is performed for the phosphor in the fluoride system on the basis of making full use of the feature of preferential growth during the generation of K$_2$SiF$_6$:Mn$^{4+}$, K$_2$GcF$_6$:Mn$^{4+}$, and K$_2$TiF$_6$:Mn$^{4+}$ phosphor powders, and phosphor particles with homogeneous morphology, high light efficiency and excellent encapsulation performance are finally determined in the manner of element replacement.

In a typical embodiment of the present application, there is provided a red phosphor powder, the red phosphor powder comprising inorganic compounds containing an element A, an element D, an element X and element manganese.

Element A is one or more selected from a group of Li, Na and K and necessarily includes element K. Element D is composed of Ge and Si, or element D is composed of Si, Ge and Ti. Element X is one or more selected from a group of F, Br and Cl and necessarily includes F. The compound has the same space group structure as K$_2$GeF$_6$, the space group structure being the hexagonal crystal system P-6$_3$mc(186).

The above red phosphor powder has a same crystal structure as K$_2$GeF$_6$ (the space group is P-6$_3$mc(186)), a crystal structure of the space group of hexagonal crystal system P-6$_3$mc(186), and therefore has the characteristics such as uniform morphology, high luminescent efficiency and good stability; a luminescent device produced by combining the above red phosphor powder with the blue light LED chip can be used as a LCD LED backlight.

In a preferred embodiment of the present disclosure, the chemical formula of the above inorganic compound is represented as A$_a$D$_{1-c}$X$_b$:cMn$^{4+}$. Controlling the parameters a and b in the above chemical formula within the ranges 1.5≤a≤2.5 and 5.5≤b≤6.5 can make the above inorganic compound has the pure phase structure of K$_2$GeF$_6$. In addition, since the phenomenon of concentration quenching exists in each of the activator ions in the phosphor, research shows that in the fluoride fluorescent material system, the activator Mn$^{4+}$ replaces element D (D is Si$^{4+}$, Ge$^{4+}$ or Ti$^{4+}$), and when the replacement is within the range of 0.01≤c≤0.3, both the pure phase structure of the phosphor product and its excellent fluorescence properties can be guaranteed.

Replacement between same-family elements can regulate the fluorescence properties of the phosphor, while replacement between elements with different radii may destroy the main phase structure of K$_2$GeF$_6$. Thus, in order to further ensure that the main phase structure of K$_2$GeF$_6$ can be maintained during the replacement process, a molar ratio of element K in element A is controlled greater than or equal to 90%, a molar ratio of element Ti in element D is controlled less than or equal to 10%, and a molar ratio of element F in element X is controlled greater than or equal to 90% when elements Li and/or Na in the I A family are used to replace a small amount of element K in the above fluorescent system of fluoride, when Si or Si and Ti are used to replace a small amount of element Ge, and when Br and/or Cl are used to replace a small amount of element F.

Replacement between same-family elements or different-family elements can form a solid solution having the same structure as the main phase, or may produce a mixture with a dual-phase structure. Under general circumstances, a crystal structure made of K$_2$GeF$_6$ material obtained in the method of normal temperature coprecipitation can only be the P3 ml space group, while this luminophor can get a P-6$_3$mc(186) space group structure with constant grain morphology only after high temperature treatment. Then, when the $K_2GeF_6$ material is doped with Si, according to the current understanding of a person skilled in the art, the structure of the product resulting from Si doping should be the P3 ml space group structure the same as $K_2GeF_6$, or a mixture of the two structures of the $K_2GeF_6$ P3 ml space group structure and the $K_2SiF_6$ $O_h^5$-Fm3m space group structure. However, it is surprisingly found in the present application that when Si or Si and Ti are used to replace Ge in the $K_2GeF_6$ material within a range under normal temperature, a $K_2GeF_6$ pure-phase product with a P-6₃mc(186) space group is obtained. As can be seen, the induction of changes in space group structure by introducing Si or Si and Ti in the present application is consistent with the induction of high-temperature heating.

Further, the applicant also finds in the research process that in $K_2GeF_6$, when element Si or elements Si and Ti replace an extremely small amount of element Ge, $K_2GeF_6$ of the P-6₃mc(186) space group begins to appear, and as the replacement increases, $K_2GeF_6$ phase in the P-6₃mc(186) space group increases gradually; when the replacement of Ge by Si is x=0.1, the product has been thoroughly $K_2GeF_6$ phase of P-6₃mc(186) space group, and when the replacement exceeds x=0.4, impure phase ($K_2GeF_6$ phase of non P-6₃mc(186) space groups) reappears, and $K_2GeF_6$ phase of P-6₃mc(186) space group decreases gradually.

The $K_2GeF_6$ product of the P3 ml space group in the synthesized $K_2GeF_6$:$Mn^{4+}$ of the present application has a sheet-like particle morphology, which is consistent with the report in the document, and it is well known in the industry that phosphor powder with this morphology has a poor application performance. The $K_2GeF_6$ particle of the P-63mc(186) space group has an octahedron morphology, which is close to a sphere, and it is also well known in the industry that phosphor powder with this morphology has a good application performance. As Si or Si and Ti replace more and more Ge, the main phase structure of the synthesized product changes, with the particle morphology subjected to the transformation process of sheet shape . . . coexistence of sheet shape and octahedron . . . octahedron . . . coexistence of sheet shape and octahedron, and during the morphology change process, all changes are between the two structures of $K_2GeF_6$ phase of P3 ml space group and $K_2GeF_6$ phase of P-6₃mc(186) space group. In order to ensure that the phosphor powder has a phase structure of a single space group, element Si partially replaces element Ge, wherein element A is element K, and element X is element F, and preferably 0.1≤x≤0.4, 0.05≤c≤0.15.

In the present disclosure, $K_2GeF_6$ is induced to transform preferentially from sheet shape to bulk shape by virtue of the preferential-growth bulk morphology of $K_2SiF_6$ by substituting Si or Si and Ti for a part of D (D is element Ge). The transformation of this crystal structure can adjust the photochromic properties such as peak wavelength and half width of the $Mn^{4+}$ luminescent center, and improves the photochromic properties of the red phosphor powder. Further, when the red phosphor powder provided in the present disclosure is used as the backlight of the luminescent device, the range of the displayed color gamut of the luminescent device can be significantly increased.

In addition, in the present disclosure, there is also provided a preparation method of red phosphor powder, the preparation method comprising: weighing compounds of element A, element D, element X, and element manganese respectively according to a stoichiometric ratio; dissolving the compounds containing each of said elements in a 20~60% HF solution respectively to obtain solving liquids containing each of said elements; mixedly dripping the solving liquids containing each of said elements and stirring to obtain a mixed solution; quietly placing, filtering and drying the mixed solution in order to obtain fluoride red phosphor powder. Preferably, vacuum filtration and stoving are employed. A sieving step is preferably comprised after drying to reasonably select the particle size.

Exemplary embodiments of the preparation method of red phosphor powder provided according to the present disclosure are described in detail below. However, these exemplary embodiments can be carried out in various forms, and should not be construed as being limited to the embodiments stated herein. It should be understood that providing these embodiments is for making the disclosure of the present application thorough and complete and fully conveying the concepts of these exemplary embodiments to persons with common skill in the art.

Firstly, compounds of element A, element D, element X and element manganese are weighed respectively based on the $A_aD_{1-c}X_b$:$cMn^{4+}$ stoichiometric ratio, and they are dissolved respectively in a 20~60% HF solution. Element A is one or more selected from a group of Li, Na and K, and element A necessarily includes element K. D is composed of Ge and Si, or D is composed of Si, Ge and Ti. X is one or more selected from a group of F, Br and Cl, and X necessarily includes element F. Being based on the stoichiometric ratio means being based on the proportion of the elements in the finally prepared red phosphor powder. Secondly, the solving liquids are mixedly dripped based on the proportion of the stoichiometric ratio, and stirred; the mixed solution is subjected to quiet settlement, vacuum filtration, drying and sieving to obtain fluoride red phosphor powder.

Thus, red phosphor powder with the components $A_aD_{1-c}Xb$:$cMn^{4+}$ can be obtained, wherein A is one or more selected from a group of Li, Na and K and necessarily includes element K. D is composed of Ge and Si, or D is composed of Si, Ge and Ti; and X is one or more selected from a group of F, Br and Cl and necessarily includes element F, and 1.5≤a≤2.5, 5.5≤b≤6.5, 0.01≤c≤0.3.

In addition, in the present disclosure there is provided a luminescent device, comprising a semiconductor luminescent chip and a fluorescent material composition, the fluorescent material composition comprising a first fluorescent material which is any of the above red phosphor powders. In this luminescent device, since the photochromic properties of the red phosphor powder are improved, the displayed color gamut of the luminescent device is significantly improved.

Preferably, the above semiconductor luminescent chip is a LED chip that emits the peak wavelength of 440~470 nm. The peak wavelength emitted by the LED chip is controlled within the range of 440~470 nm, as the excitation efficiency to the phosphor powder is high in this band, and the light efficiency of the package device is high.

In addition to the first fluorescent material, the above fluorescent material composition may further comprise a second fluorescent material, wherein the second fluorescent material may be an existing other phosphor or quantum dot, which may be selected from any or more of the following: (Y,Gd,Lu,Tb)$_3$(Al,Ga)$_5$O$_{12}$:Ce, β-SiAlON:Eu, Ca$_3$(Sc,Mg)$_2$Si$_3$O$_{12}$:Ce, (Sr,Ca)$_2$Si$_5$N$_8$:Eu, (Sr,Ca)AlSiN$_3$:Eu, (Sr,Ca,Ba,Mg)$_5$(PO$_4$)$_3$Cl:Eu, (Ca,Sr,Ba)MgAl$_{10}$O$_{17}$:Eu, Mn, 3.5MgO.0.5MgF$_2$.GeO$_2$:Mn, ZnS, ZnSe, ZnTe, CdS, CdSe, CdTe, HgS, HgSe, CdSe/CdS, CdSe/ZnS, CdSe/ZnS/ CdSe, CdS/HgS, ZnSe/CdSe, CuInS2/ZnS, ZnCuInS/ZnS, ZnSeS:Mn, ZnSe:Mn, ZnS:Mn, ZnInS:Cu, ZnSe:Cu, CdS: Mn/ZnS, ZnSe/ZnS:Mn/ZnS and CdSe:Ag. The luminescent device using the second fluorescent material can further improve the light efficiency of the packaging device and the displayed color gamut.

The beneficial effect of the present disclosure will be further described in conjunction with the embodiments.

The luminescence intensity and color coordinates in the following examples and comparative examples are detected by the HAAS-2000 high precision rapid spectral radiometer from Hangzhou Everfine Corporation.

The SEM atlas is collected by the scanning electron microscope of HITACHI S-1510 model;

In the XRD atlas, phase analysis is performed for the synthesized product using a powder X ray diffractometer of X'Pert PRO MPD model;

The excitation spectrum and emission spectrum are collected by an integrated highly sensitive fluorescent spectrometer of FluoroMax-4 model from Horiba Corporation.

Comparative Example 1

The chemical formula for the fluoride red fluorescent material prepared in this comparative example is as follows: $K_2Ge_{0.8}F_6:0.2Mn^{4+}$. The preparation method is as follows: weighing raw materials such as $K_2MnF_6$ and $K_2GeF_6$ respectively according to the stoichiometric ratio of $K_2Ge_{0.8}F_6:0.2Mn^{4+}$, dissolving them respectively in a 25 wt % HF solution to obtain a hydrofluoric acid solution of $K_2MnF_6$ and a hydrofluoric acid solution of $K_2GeF_6$, dripping the hydrofluoric acid solution of $K_2MnF_6$ and the hydrofluoric acid solution of $K_2GeF_6$ simultaneously, stirring, placing quietly, and filtering to obtain a golden yellow precipitation, i.e., red phosphor powder.

Trough SEM detection, XRD detection and emission spectrum detection, the XRD atlas, SEM atlas and spectrum of the above red phosphor powder are shown respectively in FIG. 1, FIG. 2A, FIG. 2B, and FIG. 4.

Figure 1:
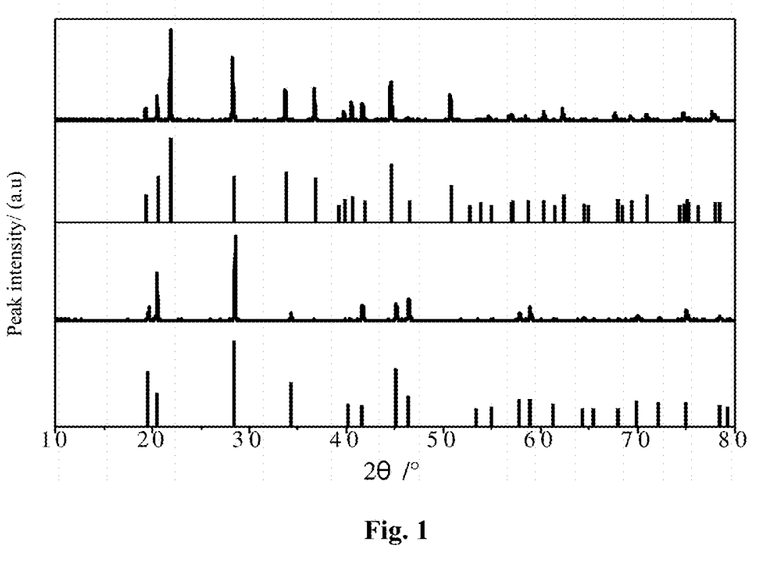
FIG. 1 illustrates XRD maps of phosphor powders composed by K$_2$Ge$_{0.8}$F$_6$:0.2Mn$^{4+}$ and K$_2$(Ge$_{0.7}$Si$_{0.1}$)F$_6$:0.2Mn$^{4+}$.

In FIG. 1, from bottom to top, the peaks represent ICSD diffraction card 24026-P3 ml contrast peak, $K_2Ge_{0.8}F_8$: $0.2Mn^{4+}$ diffraction peak, ICSD diffraction card 30310-P-$6_3$mc contrast peak, and $K_2(Ge_{0.7}Si_{0.1})F_6:0.2Mn^{4+}$ diffraction peak respectively. As can be seen from FIG. 1, the product prepared in the precipitation method in the comparative example has the same phase structure as $K_2GeF_6$ in the P3 ml space group, its diffraction atlas is consistent with the ICSD diffraction card (24026) contrast peak (the first row from bottom to top), without any impure phase and having a sharp peak, which shows that the synthesis product synthesized in the wet chemical method has a high purity.

Figure 2A:
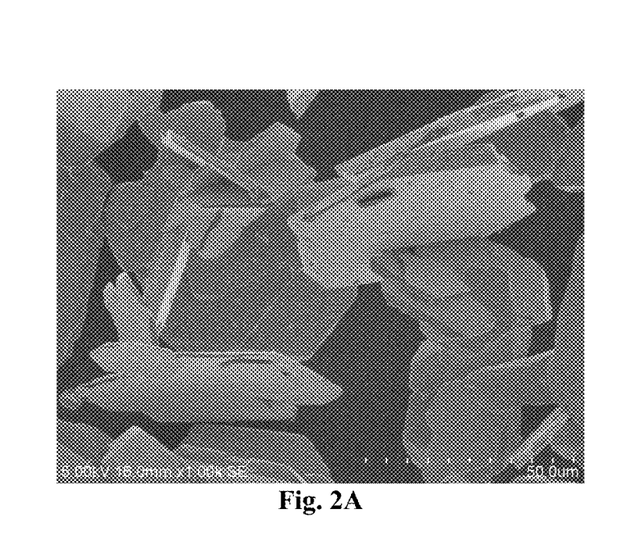
FIGS. 2A and 2B illustrate SEM maps of the phosphor powder composed by K$_2$Ge$_{0.8}$F$_6$:0.2Mn$^{4+}$.
Figure 2B:
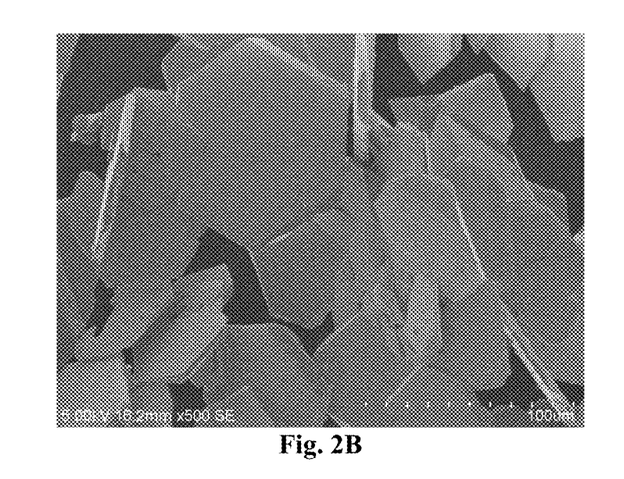

As can be seen from FIGS. 2A and 2B, the particle of the synthesis product has a uniform sheet-like morphology, with a smooth and clean surface.

Figure 4:
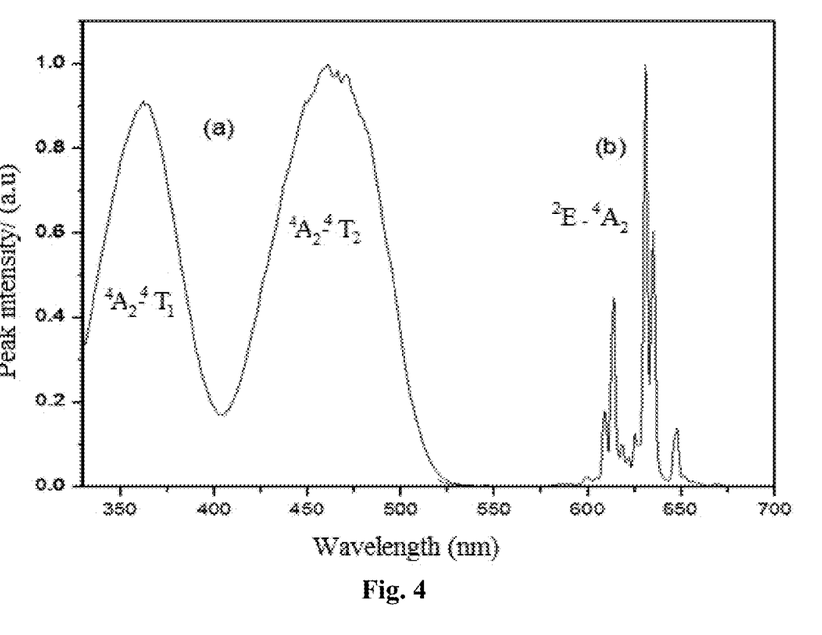
FIG. 4 illustrates the excitation spectrum ($\lambda_{em}$=631 nm) and emission spectrum ($\lambda_{ex}$=460 nm) of the phosphor powder composed by K$_2$Ge$_{0.8}$F$_6$:0.2Mn$^{4+}$.

As can be seen from FIG. 4, under an exciting light with a wavelength of 460 nm, the fluorescence spectrum of the red phosphor powder exhibits wide excitation spectrum and narrow emission spectrum, particularly it has strong excitation in the 440~460 nm blue light region, which shows that this phosphor powder is very suitable to be excited by blue light LED. Its emission spectrum has strong narrow-band emission in the red light region about 630 nm, and has no other non-red emission. This indicates that the phosphor powder can emit red light with a high color purity under blue light excitation, and can be used as high-quality LED backlight based LCD.

Example 1

Weighing raw materials such as $K_2MnF_6$, $K_2SiF_6$ and $K_2GeF_6$ respectively according to the stoichiometric ratio $K_2(Ge_{0.7}Si_{0.1})F_6:0.2Mn^{4+}$. Dissolving them respectively in a 25 wt % HF solution to obtain two mixed solutions of $K_2MnF_6$ and $K_2SiF_6$ & $K_2GeF_6$, dripping the two mixed solutions evenly according to the proportion, wherein the dripped mixed solution is subjected to stirring, quiet placing and vacuum filtering to obtain a golden yellow precipitation, i.e., the fluoride red phosphor powder.

The XRD atlas of the fluoride red phosphor powder prepared in this example is shown in FIG. 1. As can be seen from FIG. 1, its diffraction atlas is consistent with the ICSD diffraction card (30310) contrast peak (the third row from bottom to top), without any impure phase and having a sharp peak, which shows that the synthesis product has a high purity.

Figure 3A:
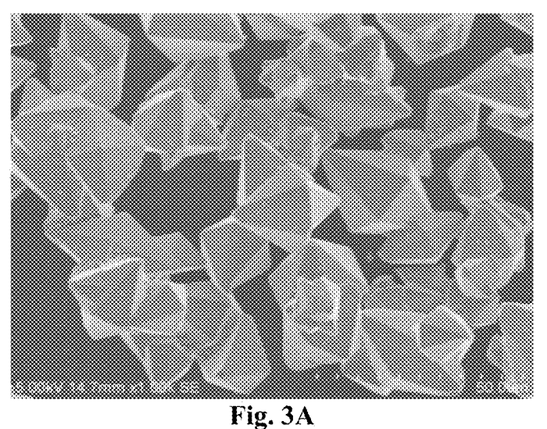
FIGS. 3A and 3B illustrate SEM maps of the phosphor powder composed by K$_2$(Ge$_{0.7}$Si$_{0.1}$)F$_6$:0.2Mn$^{4+}$.
Figure 3B:
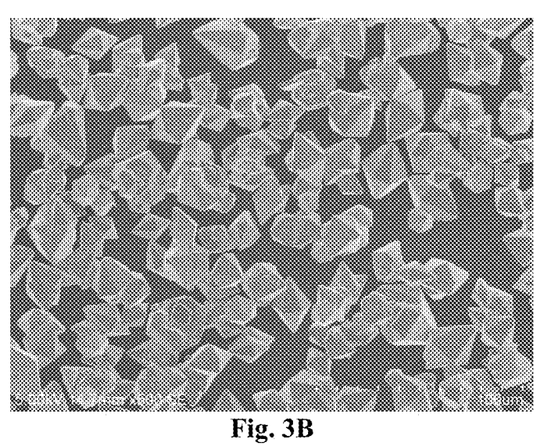

The SEM atlas of the fluoride red phosphor powder prepared in this example is shown in FIGS. 3A and 3B. As can be seen from FIGS. 3A and 3B, the particle of this phosphor powder has octahedron morphology and the particle size has a uniform distribution.

Figure 5:
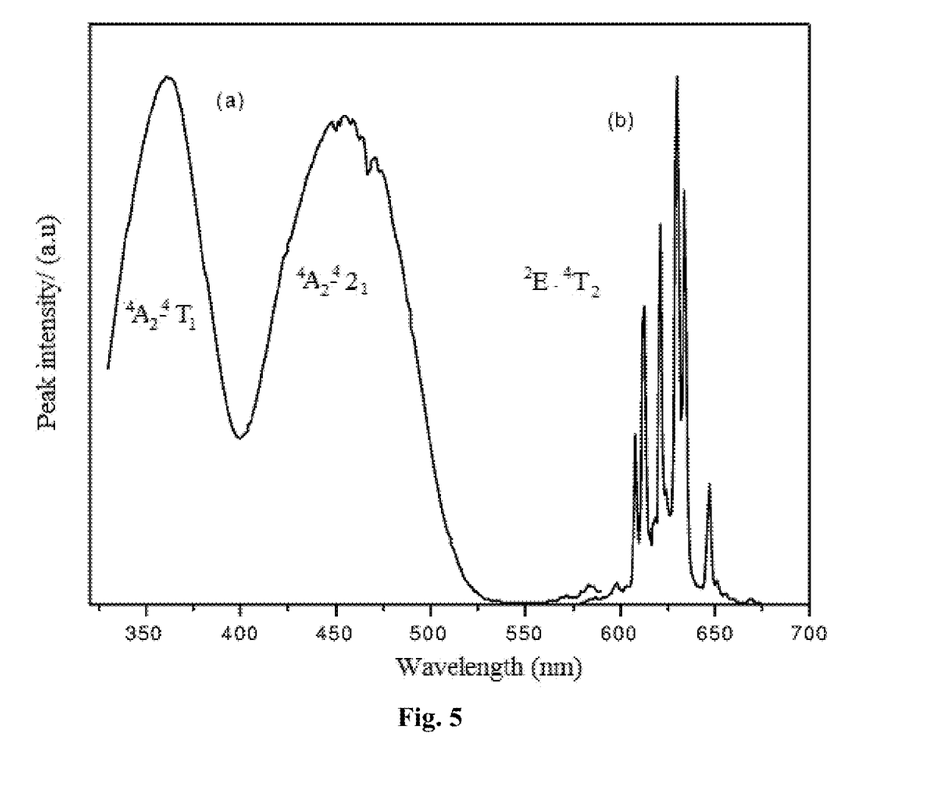
FIG. 5 illustrates the excitation spectrum ($\lambda_{em}$=630 nm) and emission spectrum ($\lambda_{ex}$=460 nm) of the phosphor powder composed by K$_2$(Ge$_{0.7}$Si$_{0.1}$)F$_6$:0.2Mn$^{4+}$.

As can be seen from FIG. 5, under an exciting light with a wavelength of 460 nm, the fluorescence spectrum of the red phosphor powder exhibits wide excitation spectrum and narrow emission spectrum, which is substantially the same as the spectrum of the synthesis product in the comparative example. Moreover, as can be seen from Table 1, the half width is 4.4 nm, which is narrower than 7.4 nm in the comparative example, its emission peak wavelength is 630 nm, 1 nm shift toward blue than the spectrum in the comparative example, and its emission spectrum has strong narrow-band emission in the red light region about 630 nm, and has no other non-red emission. In addition, the luminescence intensity of the spectrum in this example is 106% of that in the comparative example.

Example 2

Weighing raw materials such as $K_2MnF_6$, $K_2SiF_6$, $K_2GeF_6$ and NaF respectively according to the stoichiometric ratio $(Na_{0.1}K_{1.9})(Ge_{0.7}Si_{0.1})F_6:0.2Mn^{4+}$, dissolving them respectively in a 20 wt % HF solution to obtain two mixed solutions of $K_2MnF_6$ and $K_2SiF_6$, $K_2GeF_6$ & $Na_2CO_3$, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 3

Weighing raw materials such as $K_2MnF_6$, $K_2SiF_6$, $K_2GeF_6$, NaF and LiF respectively according to the stoichiometric ratio $(Li_{0.05}Na_{0.1}K_{1.85})(Ge_{0.7}Si_{0.1})F_6:0.2Mn^{4+}$. Dissolving them respectively in a 35 wt % HF solution to obtain two mixed solutions of $K_2MnF_6$ and $K_2SiF_6$, $K_2GeF_6$, NaF, NaF & LiF, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 4

Weighing raw materials such as $K_2MnF_6$, $K_2SiF_6$, $K_2GeF_6$ and LiF respectively according to the stoichiometric ratio $(Li_{0.15}K_{1.85})(Ge_{0.7}Si_{0.1})F_6:0.2Mn^{4+}$. Dissolving them respectively in a 30 wt % HF solution to obtain two mixed solutions of $K_2MnF_6$ and $K_2SiF_6$, $K_2GeF_6$ & LiF, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 5

Weighing raw materials such as $K_2MnF_6$, $K_2SiF_6$, $K_2GeF_6$ and $K_2TiF_6$ respectively according to the stoichiometric ratio $K_2(Ge_{0.7}Si_{0.2}Ti_{0.09})F_6:0.01Mn^{4+}$. Dissolving them respectively in a 49 wt % HF solution to obtain two mixed solutions of $K_2MnF_6$ and $K_2SiF_6$, $K_2GeF_6$ & $K_2TiF_6$, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 6

Weighing raw materials such as $K_2MnF_6$, $K_2SiF_6$, $K_2GeF_6$ and $K_2TiF_6$ respectively according to the stoichiometric ratio $K_2(Ge_{0.7}Si_{0.1}Ti_{0.05})F_6:0.15Mn^{4+}$. Dissolving them respectively in a 35 wt % HF solution to obtain two mixed solutions of $K_2MnF_6$ and $K_2SiF_6$, $K_2GeF_6$ & $K_2TiF_6$, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 7

Weighing raw materials such as $K_2MnF_6$, $K_2SiF_6$, $K_2GeF_6$ and NaF respectively according to the stoichiometric ratio $(Na_{0.1}K_{0.9})(Ge_{0.7}Si_{0.1})F_6:0.05Mn^{4+}$. Dissolving them respectively in a 60 wt % HF solution to obtain two mixed solutions of $K_2MnF_6$ and $K_2SiF_6$, $K_2GeF_6$ & NaF, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 8

Weighing raw materials such as $K_2MnF_6$, $K_2SiF_6$, $K_2GeF_6$ and LiF respectively according to the stoichiometric ratio $(Li_{0.14}K_{1.86})(Ge_{0.7}Si_{0.1})F_6:0.2Mn^{4+}$. Dissolving them respectively in a 50 wt % HF solution to obtain two mixed solutions of $K_2MnF_6$ and $K_2SiF_6$, $K_2GeF_6$ & LiF, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 9

Weighing raw materials such as $K_2MnF_6$, $K_2SiF_6$, $K_2GeF_6$ and NaF respectively according to the stoichiometric ratio $(Na_{0.1}K_{1.4})(Ge_{0.7}Si_{0.1})F_{5.5}:0.2Mn^{4+}$. Dissolving them respectively in a 30 wt % HF solution to obtain two mixed solutions of $K_2MnF_6$ and $K_2SiF_6$, $K_2GeF_6$ & NaF, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 10

Weighing raw materials such as $K_2MnF_6$, $K_2SiF_6$, $K_2GeF_6$ and NaF respectively according to the stoichiometric ratio $(Na_{0.1}K_2)(Ge_{0.6}Si_{0.1})F_{6.5}:0.3Mn^{4+}$. Dissolving them respectively in a 30 wt % HF solution to obtain two mixed solutions of $K_2MnF_6$ and $K_2SiF_6$, $K_2GeF_6$ & NaF, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 11

Weighing raw materials such as $K_2MnF_6$, $K_2SiF_6$, $K_2GeF_6$ and HCl respectively according to the stoichiometric ratio $K_{2.1}(Ge_{0.6}Si_{0.15})F_{5.6}Cl_{0.5}:0.25Mn^{4+}$. Dissolving them respectively in a 49 wt % HF solution to obtain two mixed solutions of $K_2MnF_6$ and $K_2SiF_6$, $K_2GeF_6$ & HCl, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 12

Weighing raw materials such as $K_2MnF_6$, $K_2SiF_6$ and $K_2GeF_6$ respectively according to the stoichiometric ratio $K_2(Ge_{0.765}Si_{0.085})F_6:0.15Mn^{4+}$. Dissolving them respectively in a 25 wt % HF solution to obtain two mixed solutions of $K_2MnF_6$ and $K_2SiF_6$ & $K_2GeF_6$, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 13

Weighing raw materials such as $K_2MnF_6$, $K_2SiF_6$ and $K_2GeF_6$ respectively according to the stoichiometric ratio $K_2(Ge_{0.57}Si_{0.38})F_6:0.05Mn^{4+}$. Dissolving them respectively in a 30 wt % HF solution to obtain two mixed solutions of $K_2MnF_6$ and $K_2SiF_6$ & $K_2GeF_6$, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 14

Weighing raw materials such as $K_2MnF_6$, $K_2SiF_6$ and $K_2GeF_6$ respectively according to the stoichiometric ratio $K_2(Ge_{0.51}Si_{0.34})F_6:0.15Mn^{4+}$. Dissolving them respectively in a 49 wt % HF solution to obtain two mixed solutions of $K_2MnF_6$ and $K_2SiF_6$ & $K_2GeF_6$, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 15

Weighing raw materials such as $K_2MnF_6$, $K_2SiF_6$ and $K_2GeF_6$ respectively according to the stoichiometric ratio $K_2(Ge_{0.855}Si_{0.095})F_6:0.05Mn^{4+}$. Dissolving them respectively in a 20 wt % HF solution to obtain two mixed solutions of $K_2MnF_6$ and $K_2SiF_6$ & $K_2GeF_6$, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 16

Weighing raw materials such as $K_2MnF_6$, $K_2SiF_6$ and $K_2GeF_6$ respectively according to the stoichiometric ratio $K_2(Ge_{0.8}Si_{0.1})F_6:0.1Mn^{4+}$. Dissolving them respectively in a 40 wt % HF solution to obtain two mixed solutions of $K_2MnF_6$ and $K_2SiF_6$ & $K_2GeF_6$, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 17

Weighing raw materials such as $K_2MnF_6$, $K_2SiF_6$ and $K_2GeF_6$ respectively according to the stoichiometric ratio $K_2(Ge_{0.65}Si_{0.4})F_6:0.05Mn^{4+}$. Dissolving them respectively in a 20 wt % HF solution to obtain two mixed solutions of $K_2MnF_6$ and $K_2SiF_6$ & $K_2GeF_6$, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 18

Weighing raw materials such as $K_2MnF_6$, $K_2SiF_6$, $K_2GeF_6$ and HBr respectively according to the stoichiometric ratio $K_2(Ge_{0.8}Si_{0.19})F_{5.5}Br_{0.5}:0.01Mn^{4+}$. Dissolving them respectively in a 25 wt % HF solution to obtain two mixed solutions of $K_2MnF_6$ and $K_2SiF_6$, $K_2GeF_6$ & HBr, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Example 19

Weighing raw materials such as $K_2MnF_6$, $K_2SiF_6$, $K_2GeF_6$ and HCl respectively according to the stoichiometric ratio $K_2(Ge_{0.6}Si_{0.1})F_{5.6}Cl_{0.4}:0.3Mn^{4+}$. Dissolving them respectively in a 25 wt % HF solution to obtain two mixed solutions of $K_2MnF_6$ and $K_2SiF_6$, $K_2GeF_6$ & HCl, dripping the two mixed solutions evenly according to the proportion, wherein the dripped mixed solution is subjected to stirring, quiet placing and vacuum filtering to obtain a golden yellow precipitation, i.e., the fluoride red phosphor powder.

Detection 1:

The optical output performance of the fluoride red phosphor powder prepared in the above comparative example 1 and examples 1-19 is detected. The detection results are shown in Table 1.

TABLE 1

Red phosphor powder in comparative example 1 and examples 1-19 and the optical output performance thereof

| | Chemical composition | Relative luminance (%) | Color coordinates x | Color coordinates y | Half width (nm) | Peak wavelength (nm) | HF concentration (wt %) |
|---|---|---|---|---|---|---|---|
| Comparative example | $K_2Ge_{0.8}F_6:0.2Mn^{4+}$ | 100 | 0.6915 | 0.3078 | 7.4 | 631 | 25 |
| Example 1 | $K_2(Ge_{0.7}Si_{0.1})F_6:0.2Mn^{4+}$ | 106 | 0.6920 | 0.3073 | 4.4 | 630 | 25 |
| Example 2 | $(Na_{0.1}K_{1.9})(Ge_{0.7}Si_{0.1})F_6:0.2Mn^{4+}$ | 101 | 0.6916 | 0.3077 | 4.4 | 630 | 20 |
| Example 3 | $(Li_{0.05}Na_{0.1}K_{1.85})(Ge_{0.7}Si_{0.1})F_6:0.2Mn^{4+}$ | 103 | 0.6918 | 0.3075 | 4.4 | 630 | 35 |
| Example 4 | $(Li_{0.15}K_{1.85})(Ge_{0.7}Si_{0.1})F_6:0.2Mn^{4+}$ | 109 | 0.6922 | 0.3071 | 4.4 | 630 | 30 |
| Example 5 | $K_2(Ge_{0.7}Si_{0.2}Ti_{0.09})F_6:0.01Mn^{4+}$ | 101 | 0.6921 | 0.3070 | 4.4 | 630 | 49 |
| Example 6 | $K_2(Ge_{0.7}Si_{0.1}Ti_{0.05})F_6:0.15Mn^{4+}$ | 105 | 0.6919 | 0.3074 | 4.4 | 630 | 35 |
| Example 7 | $(Na_{0.1}K_{1.9})(Ge_{0.7}Si_{0.1})F_6:0.05Mn^{4+}$ | 102 | 0.6917 | 0.3076 | 4.4 | 630 | 60 |
| Example 8 | $(Li_{0.14}K_{1.86})(Ge_{0.7}Si_{0.1})F_6:0.2Mn^{4+}$ | 104 | 0.6919 | 0.3073 | 4.4 | 630 | 50 |
| Example 9 | $(Na_{0.1}K_{1.4})(Ge_{0.7}Si_{0.1})F_{5.5}:0.2Mn^{4+}$ | 103 | 0.6917 | 0.3076 | 4.4 | 630 | 30 |
| Example 10 | $(Na_{0.5}K_2)(Ge_{0.6}Si_{0.1})F_{6.5}:0.3Mn^{4+}$ | 107 | 0.6920 | 0.3073 | 4.4 | 630 | 30 |
| Example 11 | $K_{2.1}(Ge_{0.6}Si_{0.15})F_{5.6}Cl_{0.5}:0.25Mn^{4+}$ | 102 | 0.6916 | 0.3076 | 4.4 | 630 | 49 |
| Example 12 | $K_2(Ge_{0.765}Si_{0.085})F_6:0.15Mn^{4+}$ | 110 | 0.6923 | 0.3070 | 4.4 | 630 | 25 |
| Example 13 | $K_2(Ge_{0.57}Si_{0.38})F_6:0.05Mn^{4+}$ | 108 | 0.6920 | 0.3071 | 4.4 | 630 | 30 |
| Example 14 | $K_2(Ge_{0.51}Si_{0.34})F_6:0.15Mn^{4+}$ | 112 | 0.6925 | 0.3068 | 4.4 | 630 | 49 |
| Example 15 | $K_2(Ge_{0.855}Si_{0.095})F_6:0.05Mn^{4+}$ | 109 | 0.6922 | 0.3071 | 4.4 | 630 | 20 |
| Example 16 | $K_2(Ge_{0.8}Si_{0.1})F_6:0.1Mn^{4+}$ | 106 | 0.6920 | 0.3072 | 4.4 | 630 | 40 |
| Example 17 | $K_2(Ge_{0.65}Si_{0.4})F_6:0.05Mn^{4+}$ | 104 | 0.6919 | 0.3073 | 4.4 | 630 | 30 |
| Example 18 | $K_2(Ge_{0.8}Si_{0.19})F_{5.5}Br_{0.5}:0.01Mn^{4+}$ | 101 | 0.6916 | 0.3077 | 4.4 | 630 | 25 |
| Example 19 | $K_2(Ge_{0.6}Si_{0.1})F_{5.6}Cl_{0.4}:0.3Mn^{4+}$ | 103 | 0.6919 | 0.3074 | 4.4 | 630 | 25 |

As can be seen from the above Table 1, as compared with comparative example 1, the above examples 1-19 uses Si and Ti to partially replace Ge, uses Li and Na to partially replace K, and uses Br and Cl to partially replace F; the emission spectrum of the obtained red phosphor powder has an emission peak of the linearly emitted $Mn^{4+}$ ion, but the peak wavelength is 1 nm to 630 nm shifted toward blue, the half width changes from 7.4 nm to 4.4 nm, and the luminescence intensity of the phosphor powder is increased by 1%-12%.

According to the above change in the fluorescence properties and in combination with XRD analysis, it is found that the fluoride red phosphor powders prepared in the above examples have a diffraction peak within the range of 10-90°, and the diffraction peaks have substantially the same shape and relative intensity. Through comparison between diffraction peaks of the phosphor powders prepared in comparative example 1 and example 1, it is found that the fluoride red powder synthesized in example 1 has a structure of P-6$_3$mc (186) space group, while the fluoride red powder synthesized in comparative example 1 has a structure of P3 m1 space group, but they both belong to the structure of hexagonal crystal system of $K_2GeF_6$.

As can be seen, the red phosphor powder prepared according to the inventive concept of the present disclosure that Si and Ti partially replace Ge, Li and Na partially replace K, and Br and Cl partially replace F has the advantageous effect of high luminescence intensity by controlling the ratio of the above components within the preferred range of the present disclosure.

Example 20

Dispersing the red phosphor powder obtained in example 1 of the present disclosure and the green phosphor powder β-SiAlON:Eu$^{2+}$ evenly into an organic silica gel according to a mass ratio of 1:1, applying the mixture resulting from the mixing and defoaming treatment on a blue light LED (emission wavelength 450 nm), drying for 3 hours under 150° C. to complete encapsulation; mixing the blue light emitted by the blue light LED and the red light and green light emitted by the phosphor powder to obtain white light LED, and testing its photochromic properties.

Example 21

Dispersing the fluoride red powder obtained in example 3 of the present disclosure and the green powder β-SiAlON:Eu$^{2+}$ evenly into an organic silica gel according to a mass ratio of 1:1, applying the mixture resulting from the mixing and defoaming treatment on a blue light LED (emission wavelength 450 nm), and drying for 3 hours under 150° C. to complete encapsulation; mixing the blue light emitted by the blue light LED and the red light and green light emitted by the phosphor powder to obtain white light LED, and testing its photochromic properties.

Example 22

Dispersing the fluoride red powder obtained in example 6 of the present disclosure and the green powder β-SiAlON:Eu$^{2+}$ evenly into an organic silica gel according to a mass ratio of 1:1, applying the mixture resulting from the mixing and defoaming treatment on a blue light LED (emission wavelength 450 nm), and drying for 3 hours under 150° C. to complete encapsulation; mixing the blue light emitted by the blue light LED and the red light and green light emitted by the phosphor powder to obtain white light LED, and testing its photochromic properties.

Example 23

Dispersing the fluoride red powder obtained in example 12 of the present disclosure and the green powder β-SiAlON:Eu$^{2+}$ evenly into an organic silica gel according to a mass ratio of 1:1, applying the mixture resulting from the mixing and defoaming treatment on a blue light LED (emission wavelength 450 nm), and drying for 3 hours under 150° C. to complete encapsulation; mixing the blue light emitted by the blue light LED and the red light and green light emitted by the phosphor powder to obtain white light LED, and testing its photochromic properties.

Example 24

Dispersing the fluoride red powder obtained in example 14 of the present disclosure and the green powder β-SiAlON:Eu$^{2+}$ evenly into an organic silica gel according to a mass ratio of 1:1, applying the mixture resulting from the mixing and defoaming treatment on a blue light LED (emission wavelength 450 nm), and drying for 3 hours under 150° C. to complete encapsulation; mixing the blue light emitted by the blue light LED and the red light and green light emitted by the phosphor powder to obtain white light LED, and testing its photochromic properties.

Example 25

Dispersing the fluoride red powder obtained in example 15 of the present disclosure and the green powder β-SiAlON:Eu$^{2+}$ evenly into an organic silica gel according to a mass ratio of 1:1, applying the mixture resulting from the mixing and defoaming treatment on a blue light LED (emission wavelength 450 nm), and drying for 3 hours under 150° C. to complete encapsulation; mixing the blue light emitted by the blue light LED and the red light and green light emitted by the phosphor powder to obtain white light LED, and testing its photochromic properties.

Example 26

Dispersing the fluoride red powder obtained in example 18 of the present disclosure and the green powder β-SiAlON:Eu$^{2+}$ evenly into an organic silica gel according to a mass ratio of 1:1, applying the mixture resulting from the mixing and defoaming treatment on a blue light LED (emission wavelength 450 nm), and drying for 3 hours under 150° C. to complete encapsulation; mixing the blue light emitted by the blue light LED and the red light and green light emitted by the phosphor powder to obtain white light LED, and testing its photochromic properties.

Comparative Example 2

Dispersing the red phosphor powder obtained in comparative example 1 of the present disclosure and the green phosphor powder β-SiAlON:Eu$^{2+}$ evenly into an organic silica gel according to a mass ratio of 1:1, applying the mixture resulting from the mixing and defoaming treatment on a blue light LED (emission wavelength 450 nm), drying for 3 hours under 150° C. to complete encapsulation; mixing the blue light emitted by the blue light LED and the red light and green light emitted by the phosphor powder to obtain white light LED, and testing its photochromic properties.

Detection 2:

The optical output performances of the white light LED prepared in the above comparative example 2 and examples 20~26 are detected. The detection results are shown in Table 2.

TABLE 2

Components of white light LED in comparative example 2 and examples 20~26 and the optical output performance thereof

| | Chemical composition | Color gamut % NTSC | x | y | Luminous flux1 m |
|---|---|---|---|---|---|
| Example 20 | Blue light LED + fluoride red powder of example 1 + green powder | 93 | 0.2477 | 0.1961 | 59.7 |
| Example 21 | Blue light LED + fluoride red powder of example 3 + green powder | 95 | 0.2488 | 0.2078 | 59.5 |
| Example 22 | Blue light LED + fluoride red powder of example 6 + green powder | 94 | 0.2482 | 0.2064 | 60.8 |
| Example 23 | Blue light LED + fluoride red powder of example 12 + green powder | 93 | 0.2482 | 0.2064 | 61.2 |
| Example 24 | Blue light LED + fluoride red powder of example 14 + green powder | 93 | 0.2482 | 0.2064 | 61.8 |
| Example 25 | Blue light LED + fluoride red powder of example 15 + green powder | 93 | 0.2482 | 0.2064 | 60.1 |
| Example 26 | Blue light LED + fluoride red powder of example 18 + green powder | 95 | 0.2482 | 0.2064 | 59.3 |
| Comparative example 2 | Blue light LED + fluoride red powder of comparative example 1 + green powder | 92 | 0.2469 | 0.1953 | 58.6 |

It can be seen from the above examples that the above examples in the present disclosure have achieved the following technical effects: in the present disclosure, the core-forming manner is induced and changed and the crystallization process is adjusted by partially replacing Ge with Si and Ti, partially replacing K with Li and Na and partially replacing F with Br and Cl, which results in a change in morphology and crystal structure of the synthesis product, and the change in morphology and crystal structure affects the luminescent environment of the activator $Mn^{4+}$, thereby the photochromic parameters of the fluoride red phosphor powder are adjusted to achieve the aim of improving the luminescence intensity of the fluoride red phosphor powder. Moreover, as can be seen from Table 2, when the red phosphor powder provided in the present disclosure is used as the backlight of the luminescent device, the range of the displayed color gamut of the luminescent device can be significantly increased.

The above are only the preferred embodiments of the present disclosure and not intended to limit the present disclosure. For those skilled in the art, various modifications and changes can be made to the present disclosure. Any modification, equivalent substitution and improvement made within the spirit and principle of the present disclosure are intended to be included within the scope of protection of the present disclosure.

What is claimed is:

1. A red phosphor powder, wherein that the red phosphor powder comprises an inorganic compound containing an element A, an element D, an element X and an element manganese,
   wherein element A is one or more selected from a group of Li, Na and K, and element A necessarily includes K;
   element D is composed of Ge and Si, or element D is composed of Si, Ge and Ti;
   element X is one or more selected from a group of F, Br and Cl, and element X necessarily includes F;
   and the inorganic compound has a same space group structure as $K_2GeF_6$, the space group structure being a hexagonal crystal system P-$6_3$mc(186), wherein that a chemical formula of the inorganic compound is represented by $A_aD_{1-c}X_b$:$cMn^{4+}$, wherein $1.5 \leq a \leq 2.5$, $5.5 \leq b \leq 6.5$, and $0.01 \leq c \leq 0.3$.

2. The red phosphor powder according to claim 1, wherein that a molar ratio of element K in element A is greater than or equal to 90%, a molar ratio of element Ti in element D is less than or equal to 10%, and a molar ratio of element F in element X is greater than or equal to 90%.

3. The red phosphor powder according to claim 1, wherein that element A in the inorganic compound is element K, and element X is element F.

4. The red phosphor powder according to claim 3, wherein that the chemical formula of the inorganic compound is represented by $K_2[(Ge_{1-x}Si_x)_{1-c}F_6]$:$cMn^{4+}$, wherein $0.1 \leq x \leq 0.4$, and $0.05 \leq c \leq 0.15$.

5. A preparation method of the red phosphor powder according to claim 1, wherein that the preparation method comprises:
   according to a stoichiometric ratio, weighing compounds of element A, element D, element X, and element manganese respectively to obtain compounds containing each of said elements;
   dissolving the compounds containing each of said elements in a 20~60 wt % HF solution respectively to obtain solving liquids containing each of said elements;
   mixedly dripping the solving liquids containing each of said elements, and stirring to obtain a mixed solution; and
   quietly placing, filtering and drying the mixed solution in sequence to obtain the red phosphor powder.

6. A luminescent device, comprising a semiconductor luminescent chip and a fluorescent material composition, the fluorescent material composition comprising a first fluorescent material, wherein that the first fluorescent material is a red phosphor powder according to claim 1.

7. The luminescent device according to claim 6, wherein that the semiconductor luminescent chip is a LED chip that emits a peak wavelength of 440~470 nm.

8. The luminescent device according to claim 7, wherein that the fluorescent material composition further comprises a second fluorescent material, which is selected from any one or more of: $(Y,Gd,Lu,Tb)_3(Al,Ga)_5O_{12}$:Ce, β-SiAlON: Eu, $Ca_3(Sc,Mg)_2Si_3O_{12}$:Ce, $(Sr,Ca)_2Si_5N_8$:Eu, (Sr,Ca)AlSiN$_3$:Eu, $(Sr,Ca,Ba,Mg)_5(PO_4)_3$Cl:Eu, (Ca,Sr,Ba)MgAl$_{10}$O$_{17}$:Eu,Mn, 3.5MgO.0.5MgF$_2$.GeO$_2$:Mn, ZnS, ZnSe, ZnTe, CdS, CdSe, CdTe, HgS, HgSe, CdSe/CdS, CdSe/ZnS, CdSe/ZnS/CdSe, CdS/HgS, ZnSe/CdSe, CuInS2/ZnS, ZnCuInS/ZnS, ZnSeS:Mn, ZnSe:Mn, ZnS:Mn, ZnInS:Cu, ZnSe:Cu, CdS:Mn/ZnS, ZnSe/ZnS:Mn/ZnS, and CdSe:Ag.

* * * * *